US012685180B2

(12) United States Patent
Koike

(10) Patent No.:   US 12,685,180 B2
(45) Date of Patent:       Jul. 14, 2026

(54) SEMICONDUCTOR DEVICE AND MANUFACTURING METHOD OF SEMICONDUCTOR DEVICE

(71) Applicant: LAPIS Technology Co., Ltd., Yokohama (JP)

(72) Inventor: Osamu Koike, Yokohama (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 368 days.

(21) Appl. No.: 18/455,811

(22) Filed: Aug. 25, 2023

(65) Prior Publication Data

US 2024/0071971 A1     Feb. 29, 2024

(30) Foreign Application Priority Data

Aug. 31, 2022    (JP) ................................ 2022-137451
Jul. 25, 2023    (JP) ................................ 2023-121009

(51) Int. Cl.
  H10P 74/20        (2026.01)
  H10W 46/00        (2026.01)
  H10W 72/20        (2026.01)

(52) U.S. Cl.
  CPC .......... H10W 46/00 (2026.01); H10P 74/203 (2026.01); H10W 46/301 (2026.01); H10W 72/234 (2026.01); H10W 72/248 (2026.01)

(58) Field of Classification Search
  CPC ....... H01L 24/13; H01L 22/12; H01L 23/544; H01L 24/14; H01L 2223/54426
  See application file for complete search history.

(56) References Cited

U.S. PATENT DOCUMENTS

2003/0139055 A1*  7/2003  Hasegawa .................. G03F 1/84
                                                          430/311
2009/0121349 A1*  5/2009  Suzuki .................... H01L 24/11
                                                          257/737
2015/0035109 A1*  2/2015  Kataoka ................ H10F 39/811
                                                          257/443
2018/0182725 A1*  6/2018  Shindo .................... H01L 24/13

FOREIGN PATENT DOCUMENTS

JP          H11-31698 A        2/1999
JP          2009-117761 A      5/2009

* cited by examiner

*Primary Examiner* — Mohammad M Choudhry
(74) *Attorney, Agent, or Firm* — Rabin & Berdo, P.C.

(57)              ABSTRACT
A semiconductor device includes a semiconductor substrate having a surface with a metal wiring on the surface, an insulating film that covers the surface of the semiconductor substrate, and a plurality of electrodes disposed on the insulating film and having mutually same planar shapes. The insulating film has a plurality of opening portions formed to face respective bottom surfaces of the plurality of electrodes and expose the metal wiring. The plurality of opening portions includes a first opening portion having a first planar configuration and a second opening portion having a second planar configuration different from the first planar configuration.

7 Claims, 14 Drawing Sheets

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority from the prior Japanese Patent Application No. 2022-137451 filed on Aug. 31, 2022 and the prior Japanese Patent Application No. 2023-121009 filed on Jul. 25, 2023, the entire contents of which are incorporated herein by reference.

BACKGROUND

1. Technical Field

The present invention relates to a semiconductor device, and more particularly, to a semiconductor device constituting a liquid crystal display driver IC.

2. Description of the Related Art

In manufacturing process of a liquid crystal display driver IC, circuits are formed by wafer process on a silicon substrate, a passivation film as a surface protection film is formed, and then bump electrodes are formed on the passivation film. Using these bump electrodes, the driver IC is mounted on a liquid crystal panel by chip on board (COB) technology or tape automated bonding (TAB) technology (for example, JP-A-H11-31698).

In case of bump electrodes used in a mounting of Chip On Glass (COG) technology, there is a technology in which a passivation film is formed on a polished insulating film, and a surface of the passivation film is planarized to planarize surfaces of the bump electrodes (for example, JP-A-2009-117761).

The bump electrodes are formed through the following manufacturing process. First, a first insulating film forming step is performed. The first insulating film forming step forms a first insulating film for covering an uppermost layer metal wiring on surface of a semiconductor substrate on which a metal wiring is formed by wafer process. Subsequently, a planarizing step is performed. The planarizing step forms a sacrificial insulating film for covering the first insulating film and polishes the sacrificial insulating film using a CMP method or the like to planarize unevenness due to the metal wiring on the uppermost layer. Next, a second insulating film forming step is performed. The second insulating film forming step forms a second insulating film on surfaces of the planarized first insulating film and sacrificial insulating film. The surface of the second insulating film reflects conditions of the surfaces of the first insulating film and the sacrificial insulating film and is planarized.

After forming the second insulating film, a resist having an opening portion is formed on the second insulating film. The opening portion of the resist is provided at a position above the uppermost layer metal wiring to which the bump electrodes are connected. Next, the second insulating film and the sacrificial insulating film are etched using an etching method to form an opening portion for exposing the uppermost layer metal wiring. After the resist is removed using an ashing method, an under barrier metal (UBM) film forming step is performed. The UBM film forming step forms a UBM film by using a sputtering method. After the UBM film is formed, a resist is formed on the UBM, and a lithography step is performed. The lithography step provides an opening portion on the resist by lithographic technology. The opening portion of the resist is formed in a region where the bump electrode is arranged.

Next, a plated metal forming step is performed. The plated metal forming step forms a plated metal using an electrolytic plating method. Thereafter, bump electrodes are formed through a resist removing step and a UBM film removing step.

SUMMARY

As described above, the bump electrodes are formed by forming the UBM film on the semiconductor substrate, subsequently forming the resist having the opening portion on the UBM film, and forming the plated metal using the electrolytic plating method. At this time, when electroplating is performed with foreign matter or the like adhered to inside of the opening portion, the plated metal grows higher than a desired height, and a bump electrode higher than the desired height is formed. There is a risk of the bump electrode breaking through an electrode on a liquid crystal panel side and damaging the liquid crystal panel when the driver IC with the bump electrodes higher than the desired height is mounted to the liquid crystal panel by COB technology.

In order to suppress such a defect from occurring, a foreign matter inspection step is provided prior to forming the bump electrodes by electroplating. The foreign matter inspection step inspects the presence or absence of the foreign matter in the opening portion of the resist, and the driver IC having a foreign matter is rejected. However, the inventors have identified that when the plated metal is formed on the planarized second insulating film, the following problems arise.

The foreign matter inspection step is performed prior to the plated metal forming step. Usually, a foreign matter inspection device used in the foreign matter inspection step allows identifying a foreign matter inspection region by recognizing a unique pattern among metallic wiring patterns recognized through the recessed and protruding patterns of the insulating film or the insulating film covering the metal wiring and performing alignment thereof. However, when the surface of the second insulating film is planarized, the recessed and protruding pattern corresponding to the uppermost layer metal wiring formed below the second insulating film and the first insulating film does not appear on the surface of the second insulating film. Thus, the alignment using the recessed and protruding pattern is not allowed. Further, since the UBM film formed on the second insulating film is an opaque film, the alignment of the foreign matter inspection device is not allowed using the wiring patterns of the uppermost layer metal wiring through the UBM film.

That is, in the above-described manufacturing process of the semiconductor device, when the foreign matter inspection is performed prior to forming the bump electrodes, in a state in which the surface of the second insulating film is flattened and the UBM film an opaque film is formed thereon, the alignment of the foreign matter inspection device is not allowed and therefore the foreign matter inspection region is not allowed to be identified. Therefore, there is a problem that the foreign matter inspection in the opening portion of the resist where the bump electrodes are to be formed are not allowed.

The present invention has been made in consideration of the problems, and an object of the present invention is to provide a semiconductor device that allows the alignment of the foreign matter inspection device prior to forming the bump electrode.

According to the present invention, a semiconductor device comprises: a semiconductor substrate having a surface provided with a metal wiring; an insulating film that covers the surface of the semiconductor substrate; and a plurality of electrodes disposed on the insulating film and having mutually same planar shapes, wherein the insulating film has a plurality of opening portions formed to face respective bottom surfaces of the plurality of electrodes and expose the metal wiring, and the plurality of opening portions include a first opening portion having a first planar configuration and a second opening portion having a second planar configuration different from the first planar configuration.

According to the present invention, a manufacturing method of semiconductor device, comprising: an insulating film forming step of forming an insulating film having a plurality of opening portions on a surface of a semiconductor substrate provided with a metal wiring, the plurality of openings exposing the metal wiring and including a first opening portion having a first planar configuration and a second opening portion having a second planar configuration, the second planar configuration being different from the first planar configuration; and a foreign matter inspection step of performing alignment of an inspection device using the second opening portion and inspecting presence or absence of foreign matter on the surface of the semiconductor substrate using the inspection device.

The semiconductor device according to the present invention allows the alignment of an inspection device for the foreign matter inspection prior to forming the bump electrodes.

BRIEF DESCRIPTION OF THE DRAWINGS

Features of the present invention will be described below with reference to the accompanying drawings.

DETAILED DESCRIPTION

Figure 1:
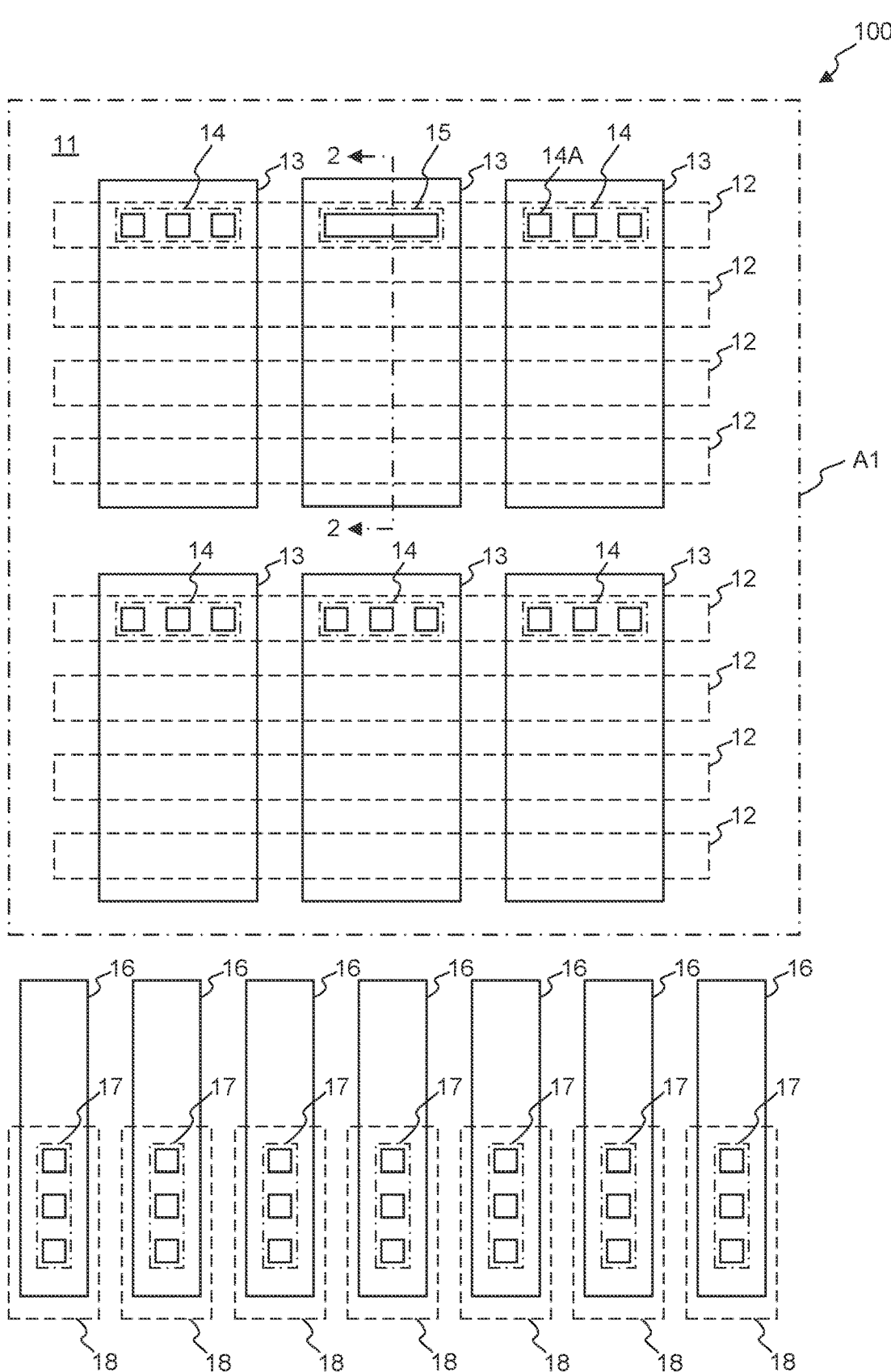
FIG. 1 is a top view illustrating a top surface of a semiconductor device 100.

Hereinafter, preferred embodiments of the present invention will be described in detail. In the following description and the accompanying drawings, substantially the same or equivalent parts are denoted by the same reference numerals.

Embodiment 1

FIG. 1 is a top view illustrating a portion of a semiconductor device 100 according to Embodiment 1 of the present invention as seen through from above an element formation surface thereof.

The semiconductor device 100 is a driver IC used as a driver for a liquid crystal display. An insulating film 11 is formed on the semiconductor device 100 so as to cover a surface of a semiconductor substrate. A plurality of metal wirings 12 are formed under the insulating film 11. A plurality of electrodes 13 are provided on the insulating film 11.

The electrodes 13 are a plurality of bump electrodes provided on a front surface of the semiconductor device 100, and are arranged at regular intervals in a predetermined repeated pattern. In the present embodiment, the electrode 13 has a substantially rectangular shape in a top view. The electrodes 13 are electrically connected to the metal wirings 12 via opening portions provided in the insulating film 11.

The insulating film 11 is provided with a plurality of opening portions including a plurality of opening portions 14 and a plurality of opening portions 15. Each of the opening portions 14 and the opening portions 15 is provided above the metal wirings 12 and corresponding to an arrangement position of the electrode 13.

The opening portion 14 is an opening portion formed to electrically connect the metal wiring 12 and the electrode 13. In this example, the opening portion 14 is constituted of three openings 14A having a substantially square planar shape. The openings 14A each have the same planar shape and are arranged in in a straight line at regular intervals along an extending direction of the metal wiring 12.

The opening portion 15 is an opening portion formed to electrically connect the metal wiring 12 and the electrode 13. In addition, the opening portion 15 is an opening portion for recognition provided for alignment of a foreign matter inspection device that inspects the presence or absence of foreign matter on a surface of the semiconductor device 100. The opening portion 15 has a shape that allows the foreign matter inspection device to recognize as the shape a unique pattern. Therefore, the alignment of the foreign matter inspection device can be performed by using the opening portion 15.

The opening portion 15 is different from the opening portion 14 in configuration (hereinafter referred to as "planar configuration") when the semiconductor device 100 is viewed from above an element mounting surface thereof. In the present embodiment, the opening portion 15 is configured of one opening having a substantially rectangular planar shape. An opening constituting the opening portion 15 has a short side having the same length as a length of a short side of the opening 14A constituting the opening portion 14 and a long side having a length different from a length of a long side of the opening 14A constituting the opening portion 14.

The opening portions 14 and the opening portion 15 are provided along an extending direction of the metal wiring 12. In the present embodiment, the openings 14A constituting the opening portion 14 are formed such that two of the four sides (two opposite sides parallel to each other) are oriented along the extending direction of the metal wiring 12, and are arranged in a straight line along the extending direction of the metal wiring. The opening portion 15 is provided such that two longitudinal sides extend along the extending direction of the metal wiring and are located on the extended line of the openings 14A arranged in the straight line.

In this example, one opening portion 15 is formed for each region of inspection field of view of the foreign matter inspection device illustrate as "A1" in FIG. 1. Region A1 includes the six electrodes 13. The opening portions 14 are formed at positions corresponding to the five electrodes 13 of Region A1, and the opening portion 15 is formed at a position corresponding to the one electrode 13.

Note that the semiconductor device 100 is provided with a plurality of electrodes 16 separately from the electrodes 13 of the above-described array pattern. The plurality of electrodes 16 are different from the electrodes 13 in planar shape. A plurality of opening portions 17 having the same planar configuration as that of the opening portion 14 are provided corresponding to the arrangement positions of the electrodes 16. Each of the electrodes 16 is connected to a metal wiring 18 provided in the semiconductor substrate via the opening portion 17.

Figure 2:
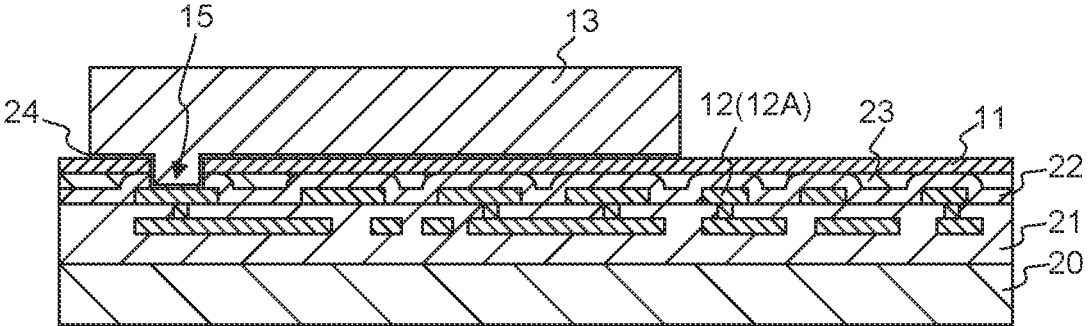
FIG. 2 is a cross-sectional view illustrating a cross section taken along the X-X line in FIG. 1.

FIG. 2 is a cross-sectional view taken along the line 2-2 in FIG. 1. A semiconductor substrate 20 is constituted of a first conductivity type (for example, p-type) Si (silicon) substrate. An insulating film 21 and a metal wiring 12 are formed on the semiconductor substrate 20. In the following description, the metal wiring 12 formed on the insulating film 21 is also referred to as an uppermost layer metal wiring 12A in particular.

An insulating film 22 is formed on the insulating film 21 so as to cover the uppermost layer metal wirings 12A. A sacrificial insulating film 23 is formed on the insulating film 22. The insulating film 22 and the sacrificial insulating film 23 are made of, for example, an oxidized film. The insulating film 22 and the sacrificial insulating film 23 have surfaces on which planarization treatment have been performed by polishing using a chemical mechanical polishing (CMP) method.

The insulating film 11 is formed on surfaces of the insulating film 22 and the sacrificial insulating film 23. The opening portion 15 is formed in the insulating film 11. A UBM film 24 is formed on the insulating film 11, and the electrode 13 is formed on the UBM film 24. The electrode 13 is connected to the uppermost layer metal wiring 12A at the opening portion 15 via the UBM film 24.

Figure 3:
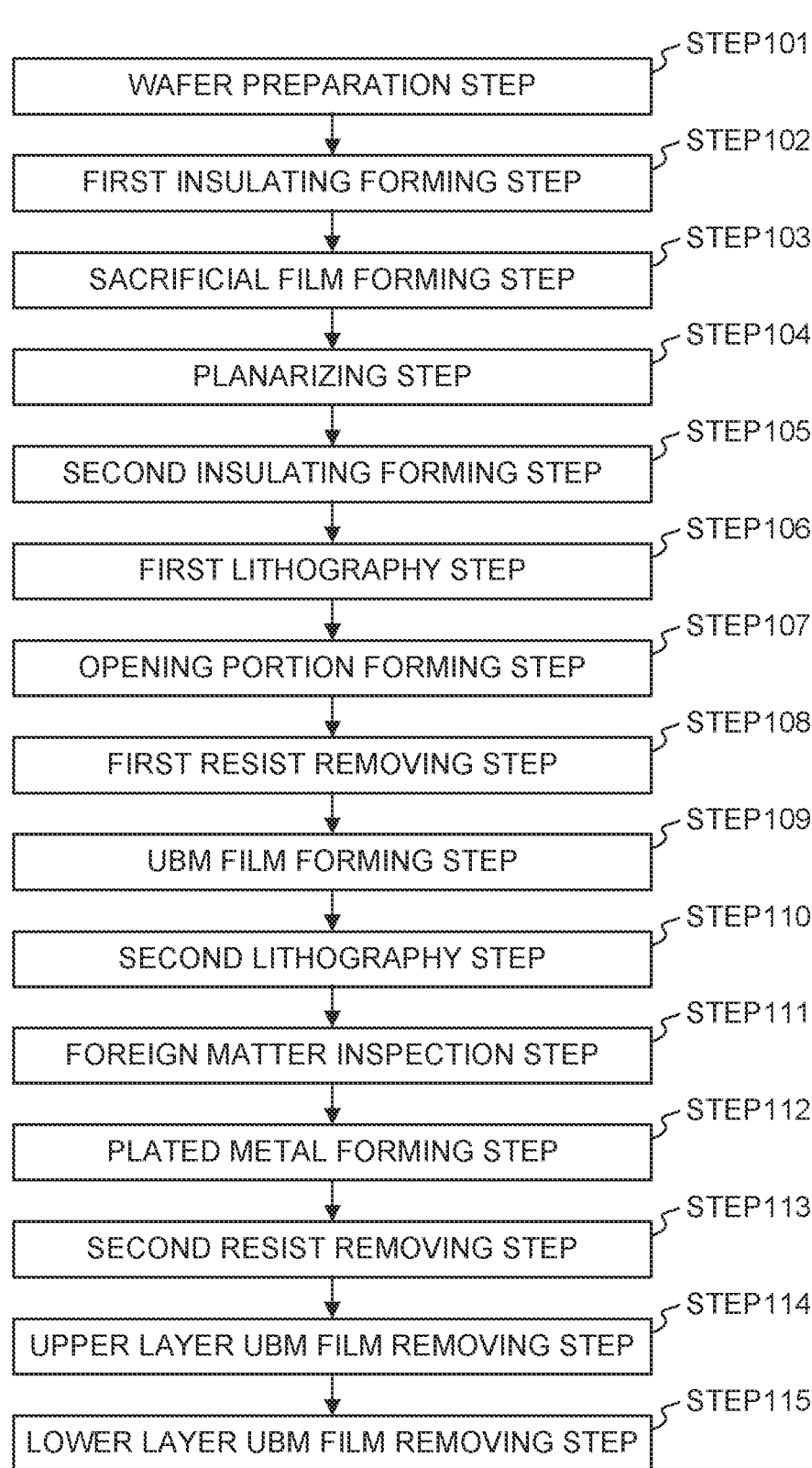
FIG. 3 is a flowchart illustrating a procedure of manufacturing the semiconductor device 100.

Next, a manufacturing method of the semiconductor device 100 will be described in accordance with a manufacturing process illustrated in FIG. 3. In the description of the respective steps, the description will be made while referring to FIGS. 4A to 4D, FIGS. 5A to 5D, FIGS. 6A to 6C, and FIGS. 7A to 7C. Each of the figures corresponds to a cross-sectional view taken along the line 2-2 of FIG. 1 (that is, FIG. 2).

Figure 4A:
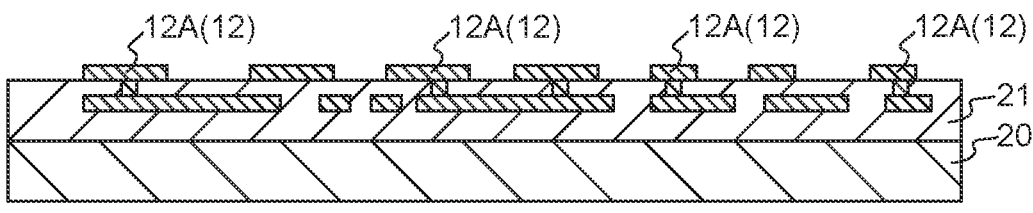
FIG. 4A is a cross-sectional view of the semiconductor device 100 in a wafer preparing step.

First, as illustrated in FIG. 4A, a semiconductor wafer including the semiconductor substrate 20, the insulating film 21 covering the semiconductor substrate 20, and the uppermost layer metal wiring 12A (metal wiring 12) formed on the semiconductor substrate 20 is prepared (wafer preparation step: STEP101). The semiconductor wafer is manufactured by a predetermined wafer process and includes diffusion layers, gate-electrodes, contacts, metal wirings, VIAs, and the like (not illustrated).

Next, a first insulating film forming step (STEP102) is performed on the wafer illustrated in FIG. 4A. Specifically, an oxidized film for covering a surface of the wafer is formed using a CVD method. As a result, as illustrated in FIG. 4B, the insulating film 22 covering surfaces of the uppermost layer metal wirings 12A and the surface of the insulating film 21 are formed.

Figure 4B:
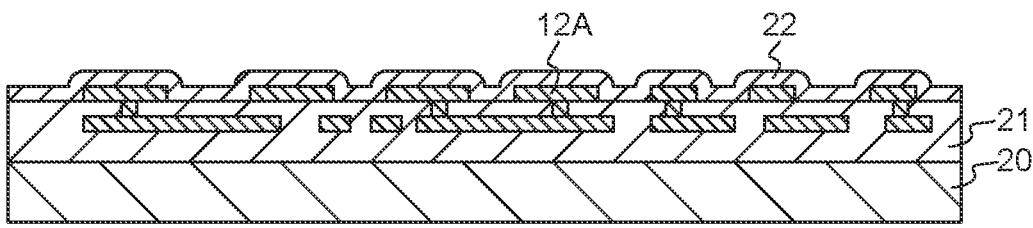
FIG. 4B is a cross-sectional view of the semiconductor device 100 in a first insulating film forming step.

Next, a sacrificial film forming step (STEP103) is performed on the wafer illustrated in FIG. 4B. Specifically, an oxidized film for covering the wafer surface is formed using a CVD method. As a result, the sacrificial insulating film 23 covering the insulating film 22 is formed as illustrated in FIG. 4C.

Figure 4C:
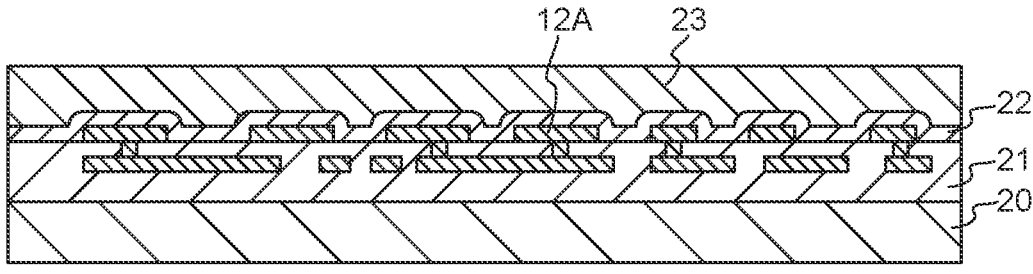
FIG. 4C is a cross-sectional view of the semiconductor device 100 in a sacrificial film forming step.

Next, a planarizing step (STEP104) is performed on the wafer illustrated in FIG. 4C. Specifically, the sacrificial insulating film 23 is polished by using a CMP method or the like, and the insulating film 22 is exposed while leaving the sacrificial insulating film 23 in recessed portions in unevenness caused by the uppermost layer metal wiring 12A. As a result, as illustrated in FIG. 4D, the wafer including the insulating film 22 and the sacrificial insulating films 23 is planarized.

Figure 4D:
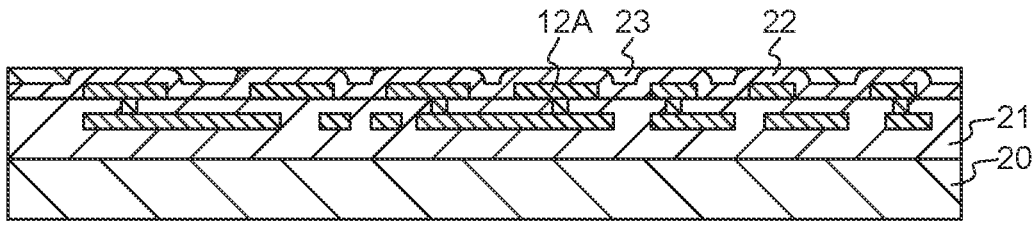
FIG. 4D is a cross-sectional view of the semiconductor device 100 in a planarizing step.
Figure 5A:
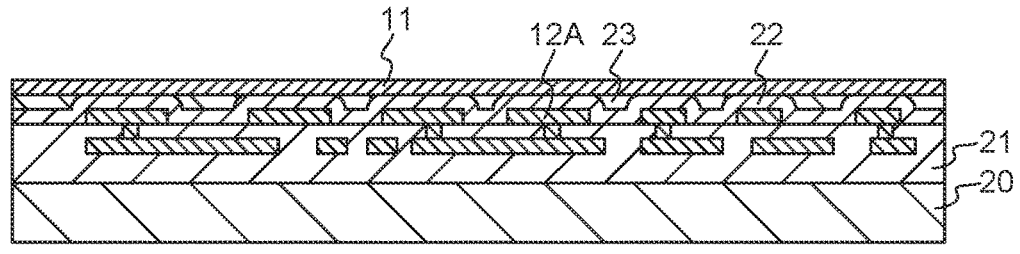
FIG. 5A is a cross-sectional view of the semiconductor device 100 in a second insulating film forming step.

Next, a second insulating film forming step (STEP105) is performed on the wafer illustrated in FIG. 4D. Specifically, a nitride film is formed so as to cover the planarized wafer surface. As a result, as illustrated in FIG. 5A, the insulating film 11 is formed on the surfaces of the insulating film 22 and the sacrificial insulating films 23. A surface of the insulating film 11 reflects a condition of the surface constituted by the insulating film 22 and the sacrificial insulating films 23 and becomes flat (that is, a smoothed surface).

Next, a first lithography step (STEP106) is performed on the wafer illustrated in FIG. 5A. Specifically, a resist 25 is formed using a lithographic technology so as to make a resist pattern having openings at respective positions corresponding to the opening portions 14 and the opening portion 15 formed in an opening portion forming step described later. As a result, the resist 25 having an opening 15A at the position corresponding to the opening portion 15 is formed as illustrated in FIG. 5B.

Figure 5B:
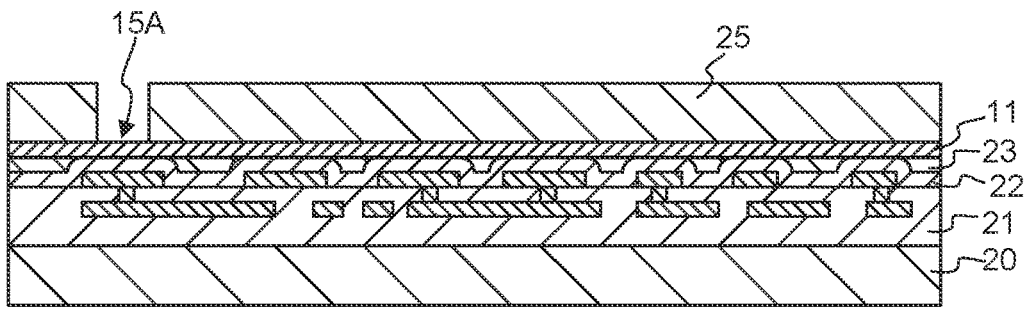
FIG. 5B is a cross-sectional view of the semiconductor device 100 in a first lithography step.

Next, the opening portion forming step (STEP107) is performed on the wafer illustrated in FIG. 5B. Specifically, an etching method is used to etch the insulating film 11 and the insulating film 22 provided at a position corresponding to the opening 15A of the resist 25 to form the opening portion 15, which exposes the uppermost layer metal wiring 12A. As a result, as illustrated in FIG. 5C, the wafer, in which a part of the surface of the uppermost layer metal wiring 12A is exposed in the opening portion 15, is formed.

Figure 5C:
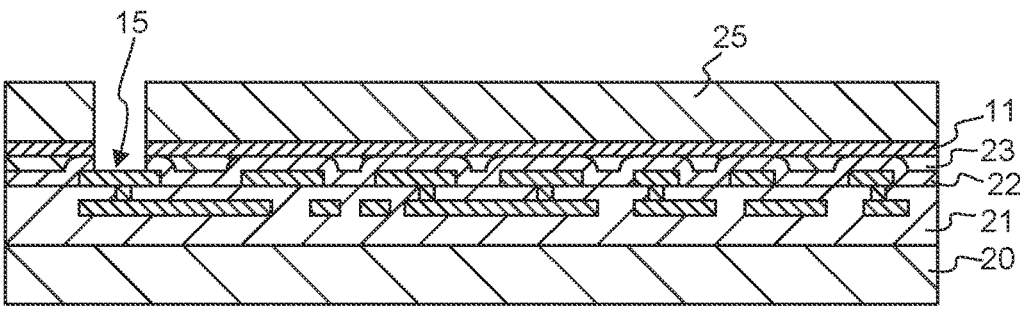
FIG. 5C is a cross-sectional view of the semiconductor device 100 in an opening portion forming step.

Next, a first resist removing step (STEP108) is performed on the wafer illustrated in FIG. 5C. Specifically, the resist 25 is removed using an ashing method. As a result, as illustrated in FIG. 5D, the wafer, in which the surface of insulating film 11 is exposed and the surface of the uppermost layer metal wiring 12A is exposed in the opening portion 15, is formed.

Figure 5D:
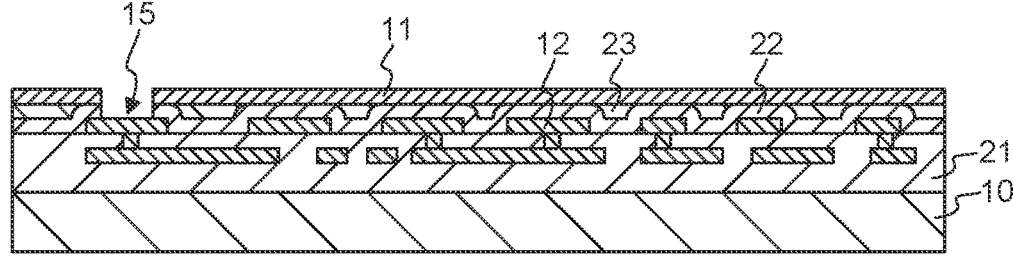
FIG. 5D is a cross-sectional view of the semiconductor device 100 in a first resist removing step.
Figure 6A:
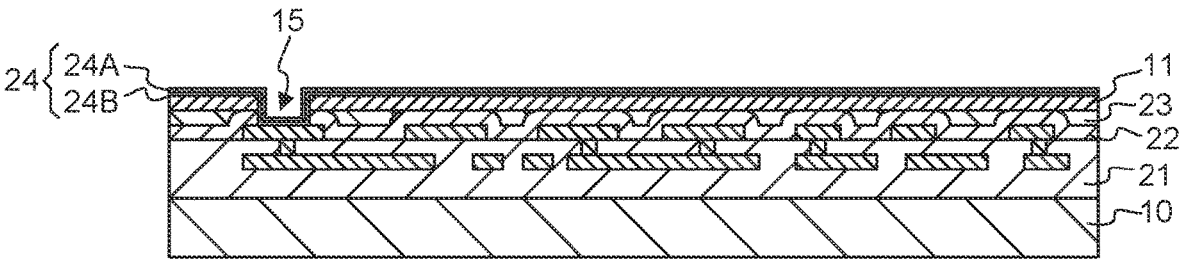
FIG. 6A is a cross-sectional view of the semiconductor device 100 in a UBM film forming step.

Next, a UBM film forming step (STEP109) is performed on the wafer illustrated in FIG. 5D. Specifically, a UBM film 24 is formed. The UBM film 24 extends to cover the surface of the insulating film 11, a sidewall of the opening portion 15, and the surface of the uppermost layer metal wiring 12A exposed by the opening portion 15. The UBM film 24 is formed by forming a stacked film, in which a lower layer UBM film 24B and an upper layer UBM film 24A are stacked, by sputtering method. As a result, as illustrated in FIG. 6A, the UBM film 24 constituted of the upper layer UBM film 24A and the lower layer UBM film 24B is formed on the wafer surface. The lower layer UBM film 24B is made of Ti, TiN, TiW, or the like, and is an adhesive layer having a function of enhancing adhesion with the insulating film 11. The upper layer UBM film 24A is constituted of an Au film or the like, and functions as a seeding layer in an electrolytic plating step to be described later.

Figure 6B:
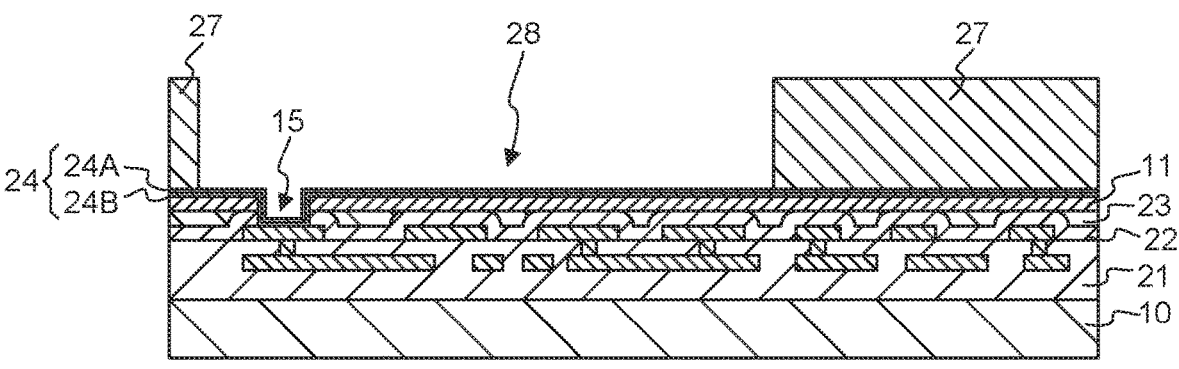
FIG. 6B is a cross-sectional view of the semiconductor device 100 in a second lithography step.

Next, a second lithography step (STEP110) is performed on the wafer illustrated in FIG. 6A. Specifically, a resist 27 is formed on the UBM film 24, and an opening portion 28 is formed using a lithographic technology. As a result, the resist 27 having the opening portion 28 is formed as illustrated in FIG. 6B. The opening portion 28 is formed in an arrangement position of the electrode 13 (a bump electrode) formed by a plated metal forming step to be described later.

Next, a foreign matter inspection step (STEP111) is performed on the wafer illustrated in FIG. 6B. The foreign matter inspection step is performed to inspect the presence or absence of foreign matter prior to forming the plated metal.

Figure 8A:
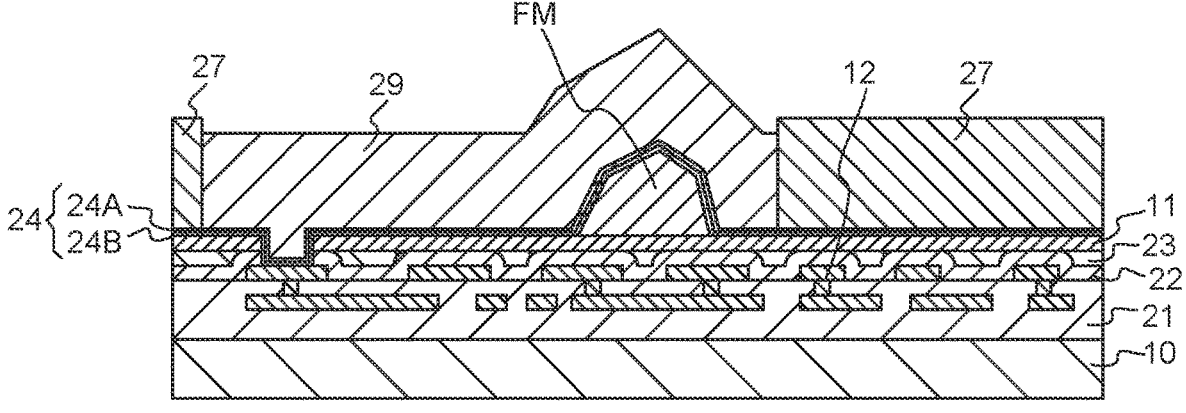
FIG. 8A is a cross-sectional view schematically illustrating a case of forming a plated metal in a presence of a foreign matter.
Figure 8B:
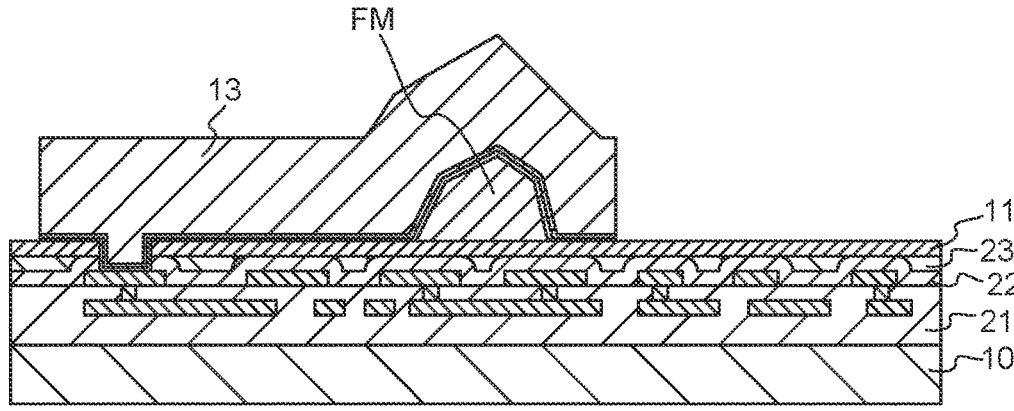
FIG. 8B is a cross-sectional view schematically illustrating a case of forming a plated metal in a presence of a foreign matter.

FIG. 8A and FIG. 8B are cross-sectional views schematically illustrating the wafers when a plated metal forming step with an assumed presence of foreign matter in the opening portion 28 is performed.

After the second lithography step, when the metal plating is formed with a presence of a foreign matter FM in the opening portion 28, the plated metal 29 grows higher than a desired height, as illustrated in FIG. 8A. Then, the electrode 13 formed after removal of the resist 27 and the UBM film 24 becomes higher than a desired height, as illustrated in 8B.

When the driver IC, on which the electrode 13 is formed, is mounted on a liquid crystal panel by COB technology, there is a possibility that the electrode 13, which is a bump electrode, breaks through an electrode of the liquid crystal panel and damages the liquid crystal panel. Therefore, it is required to inspect the presence or absence of foreign matter in the opening portion 28 using the foreign matter inspection device prior to the plated metal forming step.

The foreign matter inspection step of STEP111 is performed by alignment of the foreign matter inspection device using the opening portion 15 as a recognizable pattern and by inspecting the presence or absence of a foreign matter in the opening portion 28. As illustrated in FIG. 1, one opening portion 15 as an opening portion for recognition is provided for each region A1, which is an inspect region of the foreign matter inspection device. The foreign matter inspection is performed while executing the alignment using the opening portion 15 in each inspect region. As a result of the foreign matter inspection, the driver IC in which the presence of foreign matter is detected is recorded in a memory (not illustrated) with, for example, a position coordinate thereof on the wafer, and is then rejected in a shipping process.

Figure 6C:
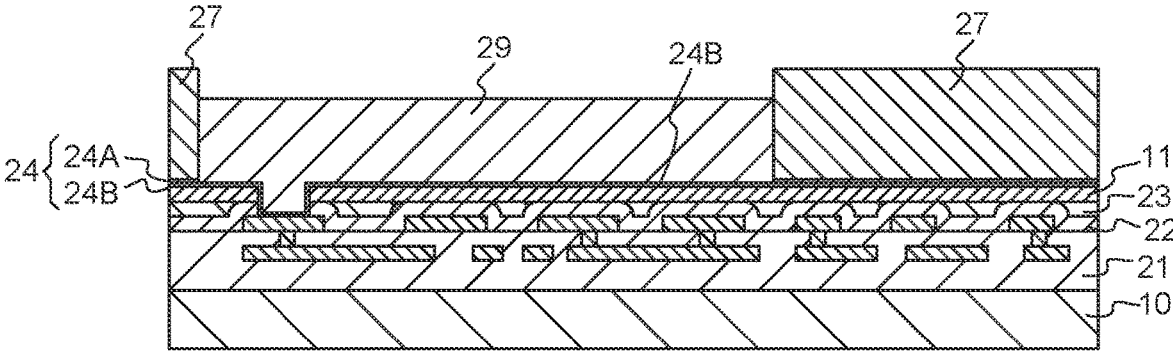
FIG. 6C is a cross-sectional view of the semiconductor device 100 in a plated metal forming step.

Next, the plated metal forming step is performed on the wafer on which the foreign matter inspection step (STEP112) has been performed. The plated metal forming step forms a plated metal using an electrolytic plating method. Specifically, the surface of the wafer on which the UBM film 24 is formed is immersed in a plating solution, and the UBM film 24 is energized to form a metal film, whereby the plated metal 29 is formed on the opening portion 28. As a result, as illustrated in FIG. 6C, the plated metal 29 is formed on the opening portion 28 of the resist 27. Note that Au, palladium, or the like is used for the plated metal 29.

Next, a second resist removing step (STEP113) is performed on the wafer illustrated in FIG. 6C. Specifically, the resist 27 is removed using a wet etching method or an ashing method. As a result, as illustrated in FIG. 7A, the resist 27 is removed, and the wafer in which the side surface of the plated metal 29 is exposed is formed.

Figure 7A:
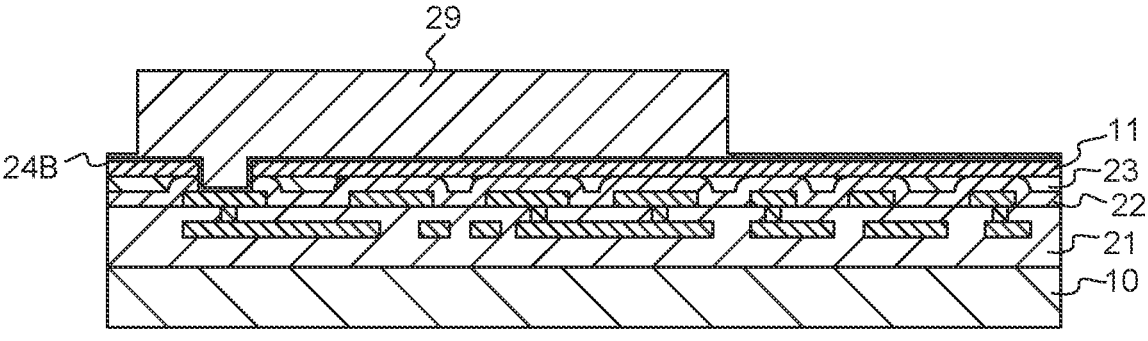
FIG. 7A is a cross-sectional view of the semiconductor device 100 in a second resist removing step.

Next, an upper layer UBM film removing step (STEP114) is performed on the wafer illustrated in FIG. 7A. Specifically, the upper layer UBM film 24A is removed by wet etching. As a result, as illustrated in FIG. 7B, the wafer from which the upper layer UBM film 24A has been removed is formed.

Figure 7B:
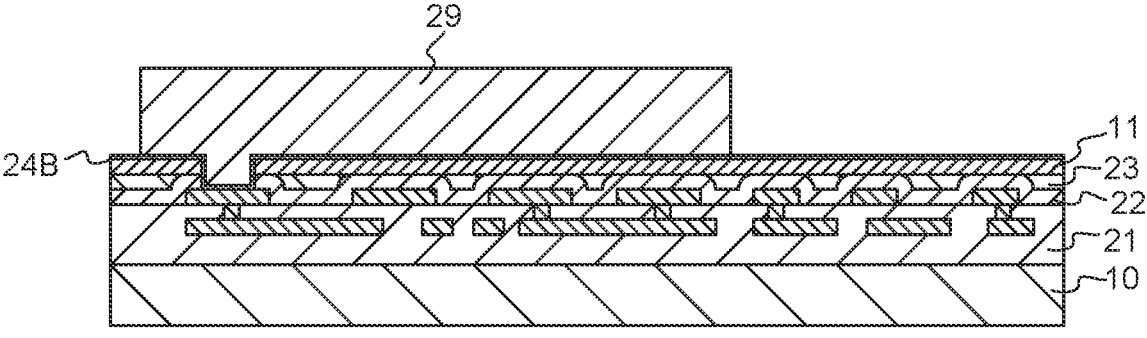
FIG. 7B is a cross-sectional view of the semiconductor device 100 in an upper layer UBM film removing step.
Figure 7C:
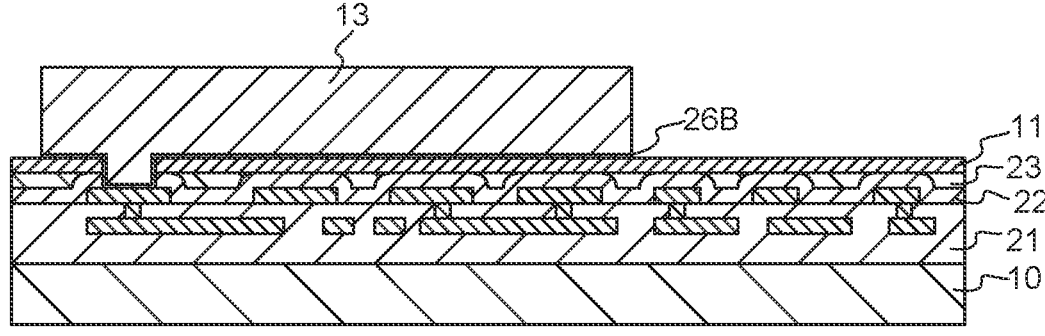
FIG. 7C is a cross-sectional view of the semiconductor device 100 in a lower layer UBM film removing step.

Next, a lower layer UBM film removing step (STEP115) is performed on the wafer illustrated in FIG. 7B. Specifically, the lower layer UBM film 24B is removed by wet etching. As a result, as illustrated in FIG. 7C, the electrode 13 as a bump electrode is formed.

The semiconductor device 100 is manufactured through the above-described steps.

In the semiconductor device 100 of the present embodiment, the opening portion 15 is provided in addition to the conventional opening portion 14 provided for connecting the electrode 13 and the metal wirings 12. The opening portion 15 has a shape in which the foreign matter inspection device can recognize the shape as a unique pattern, and the alignment of the foreign matter inspection device can be performed by using the opening portion 15.

As described above, the opening portion 15 is formed in the opening portion forming step (STEP107) prior to the foreign matter inspection step (STEP111). The opening portion 15 is provided for each region corresponding to the inspection field of view of the foreign matter inspection device. In the foreign matter inspection step, the foreign matter inspection can be performed over the entire region of the wafer surface by repeatedly executing the alignment and the foreign matter inspection by changing regions. After the foreign matter inspection step is performed, the opening portion 15 is also used as an opening portion for connecting the electrodes 13 and the metal wiring 12, similarly to the conventional opening portion 14.

Figure 9:
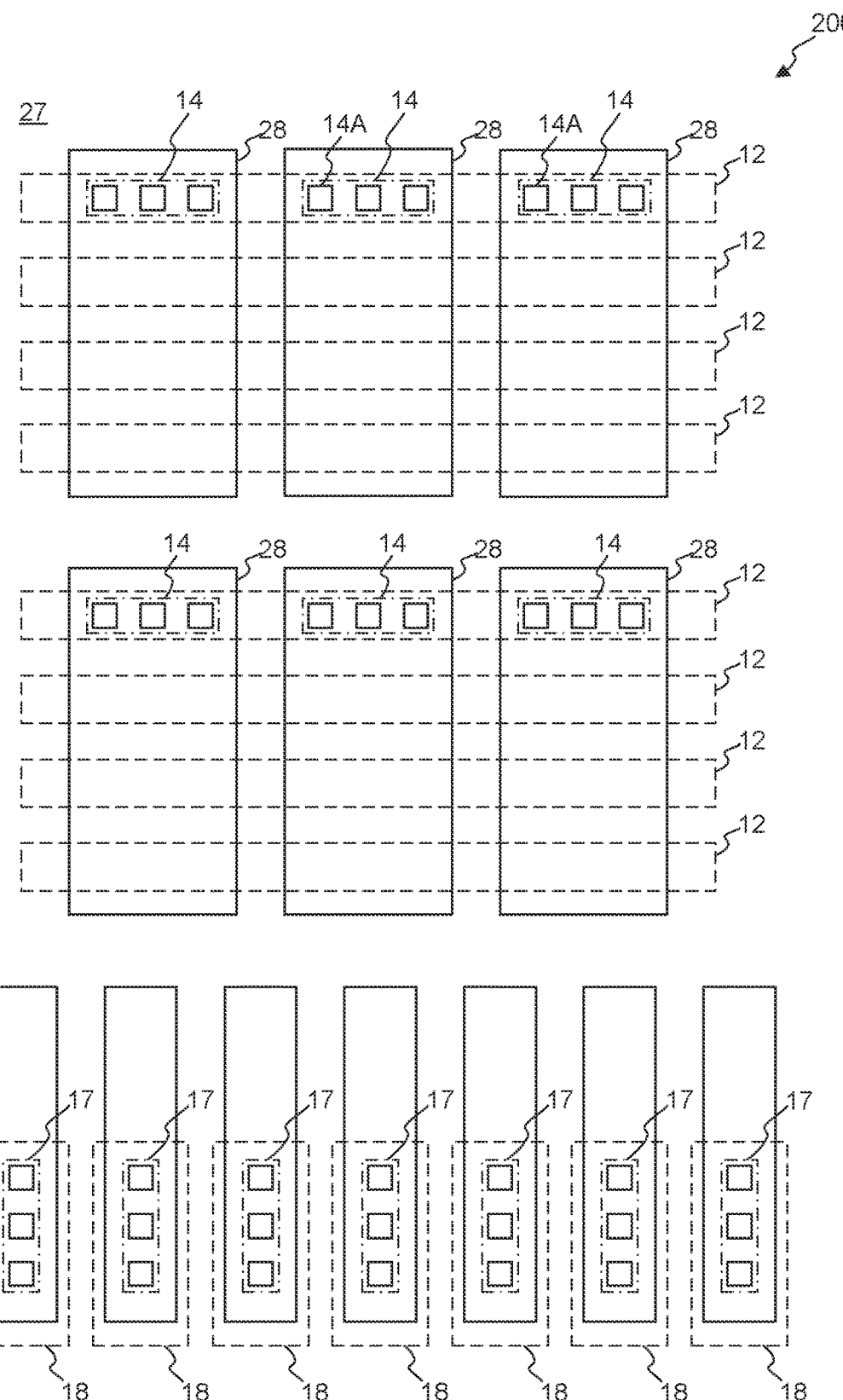
FIG. 9 is a top view illustrating an upper surface of a semiconductor device 200 of a comparative embodiment.

FIG. 9 is a top view illustrating a configuration of a semiconductor device 200 of a comparative embodiment that does not include an opening portion for recognition, unlike the present embodiment. Here, the status prior to the foreign matter inspection step (STEP111) is illustrated. That is, FIG. 9 is a top view corresponding to the condition of FIG. 6B in the semiconductor device 100 of the present embodiment.

The resist 27 having the opening portion 28 is formed on the surface of the semiconductor device 200 prior to the foreign matter inspection step. The opening portion 28 is an opening portion of the resist 27 corresponding to an arrangement position (that is, a plated metal forming position) of a bump electrode to be formed in a later step, and has a substantially rectangular planar shape in a top view. A plurality of the opening portions 28 are provided at regular intervals along a predetermined arrangement pattern.

The opening portion 14 for connecting the electrode 13 and the metal wiring 12 is formed in each of the opening portions 28. The opening portion 14 is configured 10 by arranging three openings 14A having a substantially square planar shape in a straight line at regular intervals.

In the semiconductor device 200 of the comparative embodiment, unlike the semiconductor device 100 of the present embodiment, the opening portion for recognition for performing the alignment of the foreign matter inspection device is not formed. Therefore, the following problem occurs.

When the foreign matter inspection is performed before the bump electrode is formed, that is, before the plated metal forming step, the alignment of the foreign matter inspection device needs to be performed. For example, the foreign matter inspection region can be identified by recognizing a unique pattern among the metal patterns through the recessed and protruding pattern of the insulating film or the insulating film that cover the metal wiring, and performing the alignment.

However, the insulating film 11 formed on the surfaces of the insulating film 22 and the sacrificial insulating film 23 is smoothed by an effect of planarization of the insulating film 22 and the sacrificial insulating film 23 performed in STEP104. Therefore, the recessed and protruding pattern corresponding to the shape of the uppermost layer metal wiring 12A does not appear on the surface of the insulating film 11, and the alignment of the foreign matter inspection device using the recessed and protruding pattern cannot be performed. Further, since the UBM film 24 as an opaque film is provided on the insulating film 11, it is not possible to perform the alignment using the wiring pattern of the uppermost layer metal wiring 12A to be recognized through the insulating film 11.

Therefore, in the semiconductor device 200 of the comparative embodiment, the alignment of the foreign matter inspection device cannot be appropriately performed. Therefore, the inspect region cannot be identified, and the foreign matter inspection in the opening portion 28 cannot be performed.

In contrast, in the semiconductor device 100 of the present embodiment, in addition to the opening portion 14 provided for connecting the electrode 13 and the uppermost layer metal wiring 12A, the opening portion 15 is formed as an opening portion for recognition that is different from the opening portion 14 in planar configuration. The opening portion 14 is provided for each region corresponding to the inspection field of view of the foreign matter inspection device. By using the opening portion 14 as a recognizable pattern, the alignment of the foreign matter inspection device can be performed.

Therefore, with the semiconductor device 100 of the present embodiment, even when the surface of the insulating film 11 is smoothed and the UBM film 24 as an opaque film is formed, the foreign matter inspection prior to forming the bump electrodes can be performed over the entire wafer by performing the alignment of the foreign matter inspection device and transitioning inspection target regions.

Note that the present invention is not limited to the above-described embodiment. For example, in the above embodiment, an example has been described in which the opening portion 15, which is an opening portion for recognition, is configured as an opening having a substantially rectangular planar shape. However, the opening portion 15 is not limited to the one in the embodiment described above, and it is sufficient that the opening portion 15 has a planar configuration that is different from that of the opening portion 14 when viewed from above.

Figure 10A:
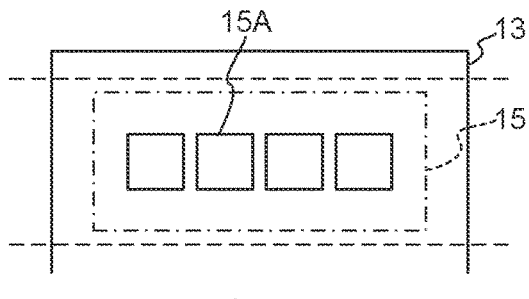
FIG. 10A is a top view illustrating a modification of an opening portion for recognition.

For example, as illustrated in FIG. 10A, the opening portion 15 may be configured of a plurality of openings 15A. In this case, even when each of the openings 15A constituting the opening portion 15 has the same planar shape as the openings 14A constituting the opening portion 14 illustrated in FIG. 1, it can be used for the alignment of the foreign matter inspection device as an opening portion having an planar configuration different from the opening portion 14 when the number of openings constituting the opening portion 15 is different from the number of openings constituting the opening portion 14.

Figure 10B:
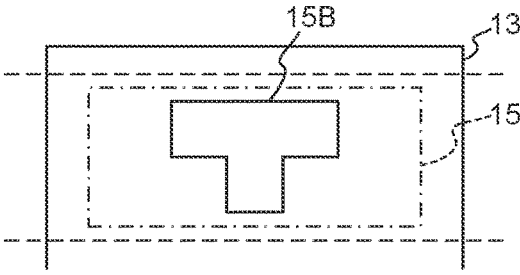
FIG. 10B is a top view illustrating a modification of an opening portion for recognition.
Figure 10C:
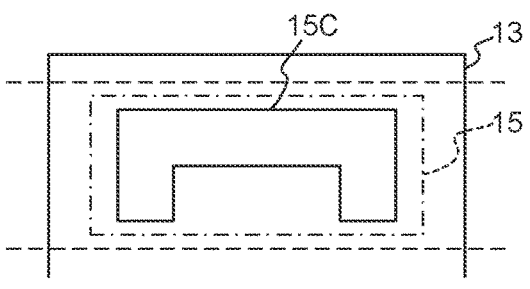
FIG. 10C is a top view illustrating a modification of an opening portion for recognition.
Figure 10D:
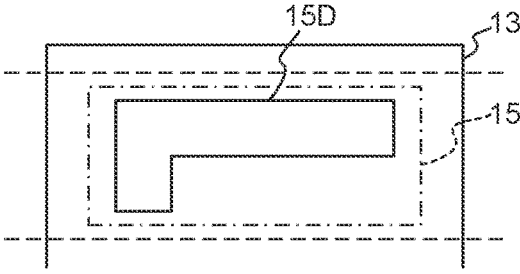
FIG. 10D is a top view illustrating a modification of an opening portion for recognition.
Figure 10E:
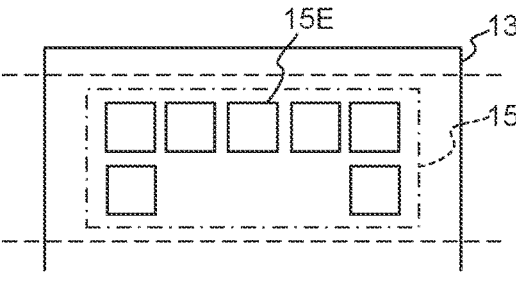
FIG. 10E is a top view illustrating a modification of an opening portion for recognition.

In addition, the opening portion 15 may be constituted by an opening 15B having a T-shape or a protruding shape as illustrated in FIG. 10B, an opening 15C having a U-shape or a recessed shape as illustrated in FIG. 10C, an opening 15D having an L-shape as illustrated in FIG. 10D, or the like. Further, as illustrated in FIG. 10E, a plurality of openings 15E may be arranged so as to have these shapes. In this way, the more distinguishing planar configuration the opening portion 15 has, the more easily the alignment of the foreign matter inspection device can be performed.

Embodiment 2

Figure 11:
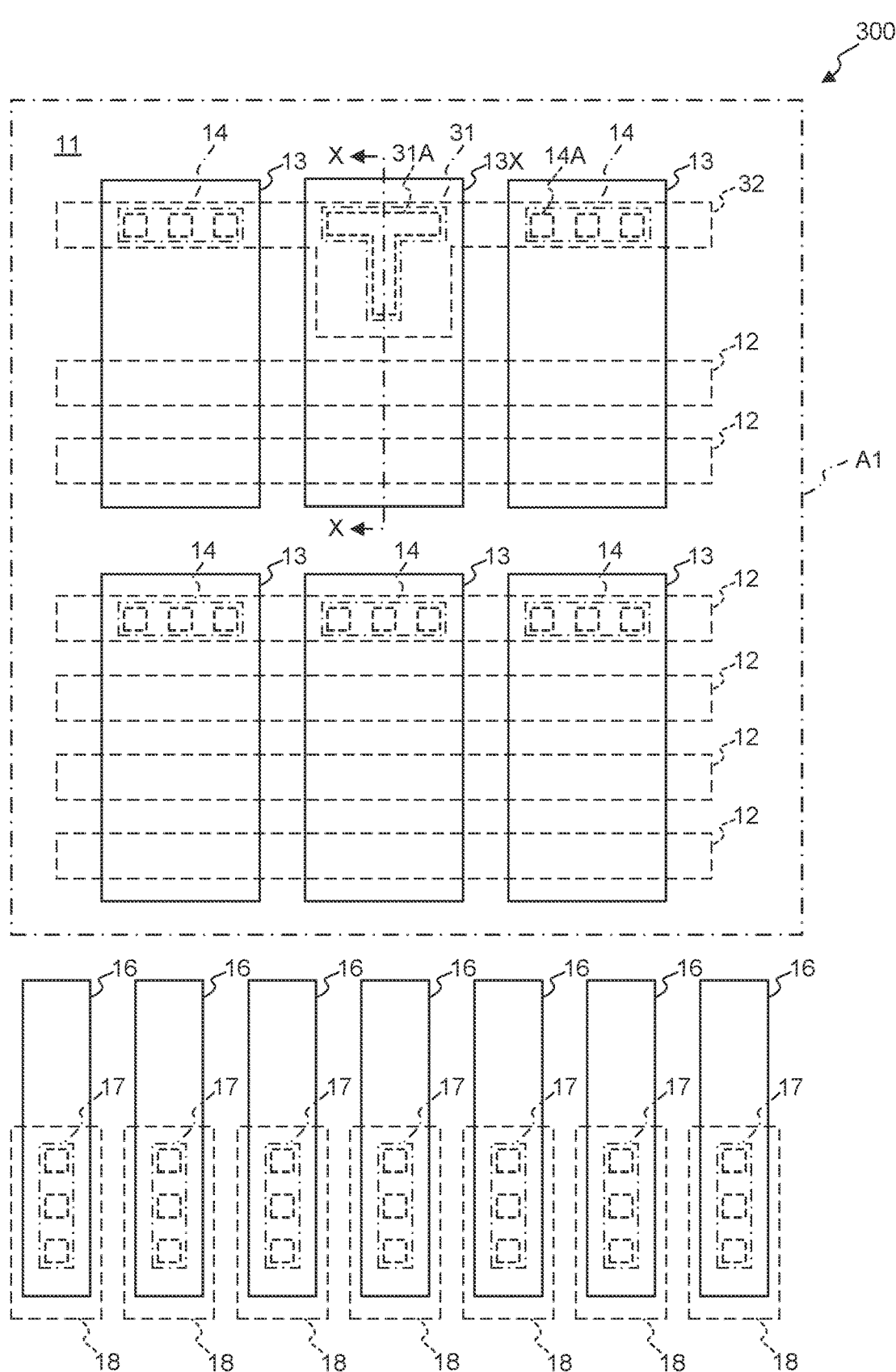
FIG. 11 is a top view illustrating a top surface of a semiconductor device 300 according to Embodiment 2.

Next, Embodiment 2 of the present invention will be described. FIG. 11 is a top view illustrating a part of a semiconductor device 300 according to Embodiment 2 of the present invention.

Similarly to the semiconductor device 100 of Embodiment 1, the insulating film 11 is formed on the semiconductor device 300 so as to cover the surface of the semiconductor substrate. The plurality of electrodes 13 are provided on the insulating film 11. The electrodes 13 have a substantially rectangular shape in the top view, and are arranged in a matrix (that is, in rows and columns).

The insulating film 11 is provided with a plurality of opening portions 14 and an opening portion 31 having a shape and a size that differ from those of the opening portions 14. The opening portion 31 is formed for each region of an inspection field of view of the foreign matter inspection device. The opening portion 31 is an opening portion formed to electrically connect the metal wiring 32 to the electrode 13, and is an opening portion for recognition provided for performing the alignment of the foreign matter inspection device that inspects the presence or absence of foreign matter on the surface of the semiconductor device 300.

The one opening portion 31 is formed for each region of the inspection field of view of the foreign matter inspection device illustrated as "A1" in FIG. 11. In this embodiment, the opening portion 31 is formed in a region in which one of the six electrodes 13 (illustrated as 13X in FIG. 11) provided in the region A1 is disposed.

The opening portion 31 is configured by an opening 31A. The opening 31A is larger than an opening 14A constituting the opening portion 14 and has a shape allowed to be recognized as a unique pattern by the foreign matter inspection device. In this embodiment, the opening 31A has a T-shaped planar shape when viewed from above.

A plurality of metal wirings 12 are formed under the insulating film 11. Each of the metal wirings 12 has a strip-shaped planar shape extending across arrangement regions of the plurality of electrodes 13 in a top view.

In addition, a metal wiring 32 having a planar shape that differs from that of the metal wiring 12 in the top view is formed under the insulating film 11. In this embodiment, the metal wiring 32 has a shape extending across the electrode 13X and the arrangement regions of the electrodes 13 disposed adjacently thereto. The metal wiring 32 has a strip-shaped region extending in the same line-width as that of the metal wiring 12, and a rectangular-shaped region protruding from the strip-shaped region.

Figure 12:
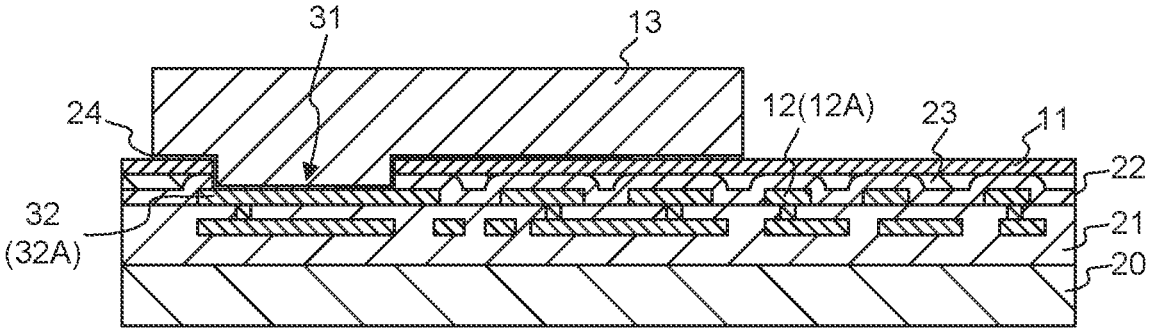
FIG. 12 is a cross-sectional view taken along the X-X line in FIG. 11.

FIG. 12 is a cross-sectional view taken along the X-X line in FIG. 11. The insulating film 21, the metal wirings 12, and the metal wiring 32 are formed on the semiconductor substrate 20.

The insulating film 22 is formed on the insulating film 21 to cover the uppermost layer metal wirings 12A corresponding to the metal wirings 12 and an uppermost layer metal wiring 32A corresponding to the metal wiring 32. The sacrificial insulating film 23 is formed on the insulating film 22. The insulating film 22 and the sacrificial insulating film 23 are planarized by polishing using a CMP method.

The insulating film 11 is formed on the surfaces of the insulating film 22 and the sacrificial insulating film 23. The opening portion 31 is formed in the insulating film 11. The UBM film 24 is formed on the insulating film 11, and the electrode 13 is formed on the UBM film 24. The electrode 13 is connected to the uppermost layer metal wiring 32A at the opening portion 31 via the UBM film 24.

Figure 13:
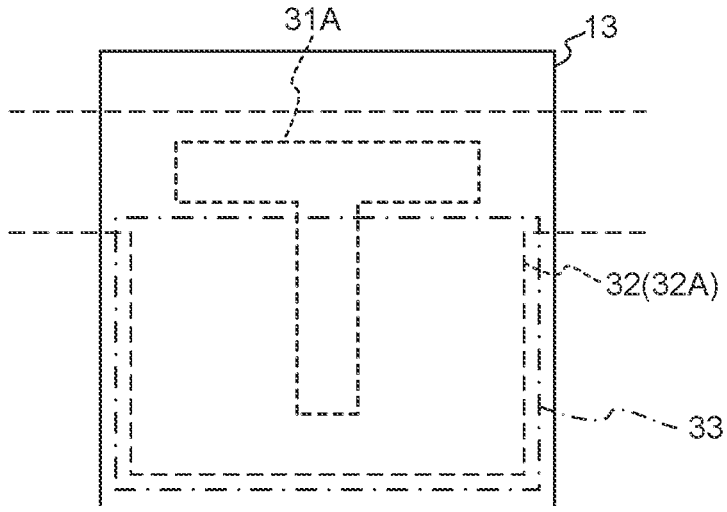
FIG. 13 is an enlarged top view of a periphery of an opening portion for recognition of FIG. 11.

FIG. 13 is an enlarged top view of a region including the opening 31A of FIG. 11. The uppermost layer metal wiring 32A of the metal wiring 32 has an opening-portion-for-recognition connecting wire portion including a rectangular extension region 33 at a position where the opening 31A is formed. In the opening-portion-for-recognition connecting wire portion, a wiring width in a direction perpendicular to (hereinafter simply referred to as a wiring width) a wiring direction of the metal wiring 32 (that is, an arrangement direction of the electrodes 13 and 13X connected to the metal wiring 32) is larger than a wiring width of another portion by an amount corresponding to the extension region 33. By the presence of the opening-portion-for-recognition connecting wire portion having the shape, the opening 31A having a size as illustrated in FIG. 13 is allowed to be formed in the opening portion forming step (see STEP107 of Embodiment 1) by etching.

The opening 31A has a T-shape including a first portion extending in a direction (lateral direction) along the wire direction of metal wiring 32 and a second portion extending in a direction (longitudinal direction) perpendicular to the first portion. The first portion is located within a region (hereinafter referred to as a strip region) in the same line-width as that of the metal wiring 12 of the metal wiring 32. The second portion extends protruding from the range of the strip region to the extension region 33.

As described above, the opening 31A constituting the opening portion for recognition of this embodiment has a longitudinal length larger than the wiring width of the conventional metal wiring 12, and has a size that makes it easier for the foreign matter inspection device to recognize as a unique pattern. Since a size of the opening as a unique pattern is larger than the opening constituting the opening portion 15 of Embodiment 1, the recognition rate of the alignment in the foreign matter inspection step can be further improved.

In addition, generally, the plurality of uppermost layer metal wirings 12A (the uppermost layer metal wiring of the metal wiring 12) disposed under the bump electrodes connected to the same potential have the same shape with the same width in the top view. If the uppermost layer metal wirings 12A were not disposed immediately under the opening portions when forming the opening portions by etching, the etching of the opening portions would proceed and the opening portions would reach the metal wirings 12 disposed under the uppermost layer metal wirings 12A. The arrival of the opening portions to the metal wiring 12 disposed under the uppermost layer metal wirings 12A possibly cause the electrodes 13 to connect to an originally unintended metal wiring 12. For this reason, the opening portion is not allowed to be disposed at a position where the uppermost layer metal wiring is not disposed.

In contrast, in the semiconductor device 300 of this embodiment, among the neighboring bump electrodes connected to the same potential, the opening-portion-for-recognition connecting wire portion having the extension region 33 with a size corresponding to the opening portion 31 is provided with the uppermost layer metal wiring 32A (the uppermost layer metal wiring of the metal wiring 32) disposed under the bump electrode having the opening portion 31 as the opening portion for recognition. Therefore, the opening portion 31 having a large opening size can be formed as the opening portion for recognition on the opening-portion-for-recognition connecting wire portion by etching. Accordingly, it is possible to provide the opening portion for recognition having a size suitable for the alignment in the foreign matter inspection step.

Note that the opening portion for recognition may be formed across the region of the strip-shaped portion of the metal wiring 32 and the rectangular extension region 33 like the opening portion 31 of this embodiment, or may be formed only in the extension region 33.

Further, the shape of the opening of the opening portion for recognition is not limited to the one illustrated in FIG. 13. For example, the opening constituting the opening portion 31 may have a size and a shape similar to those of the opening 31A when viewed from above with their orientation changed.

Figure 14A:
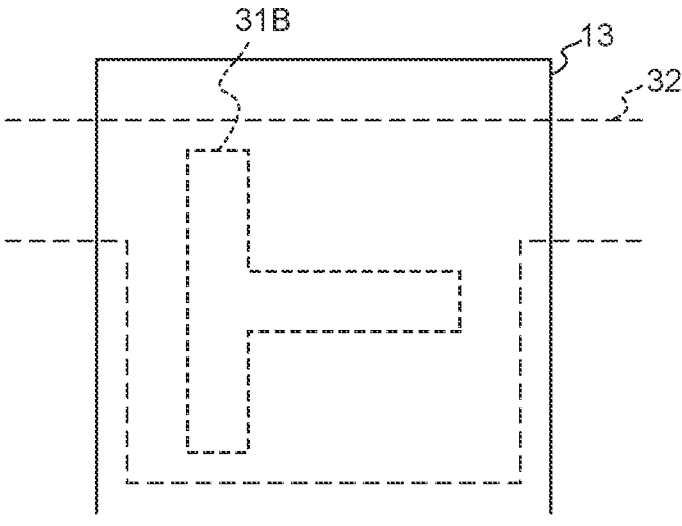
FIG. 14A is a top view illustrating an opening portion for recognition according to a modification.

FIG. 14A is a top view illustrating a shape of an opening 31B as an opening of an opening portion for recognition according to a modification thereof. The opening 31B has a planar shape of the opening 31A of FIG. 13 rotated 90 degrees counter-clockwise.

Figure 14B:
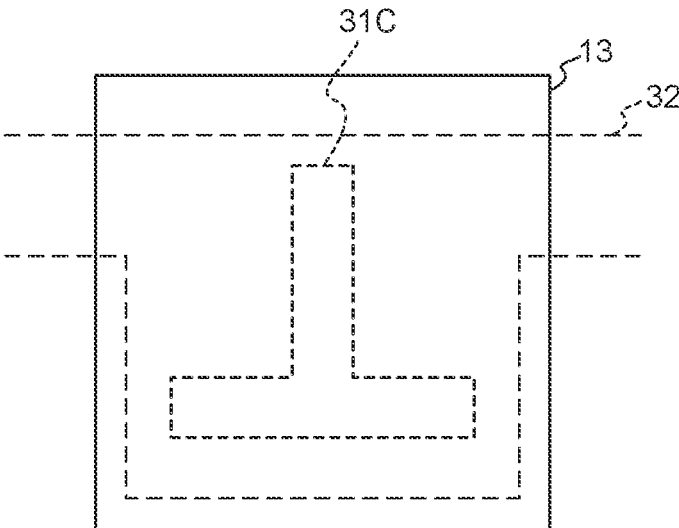
FIG. 14B is a top view illustrating an opening portion for recognition according to another modification.

FIG. 14B is a top view illustrating a shape of an opening 31C as an opening of an opening portion for recognition according to another modification. The opening 31C has a planar shape with the upper limit of the opening 31A of FIG. 13 inverted, that is rotated 180 degrees.

The opening shapes of these modifications are also the shapes that can be recognized as the unique patterns. In addition, the opening portions of the modified embodiments are larger than openings constituting the opening portion 14 as the conventional opening portion and the opening portion 15 of Embodiment 1. Therefore, by using the openings having these shapes as the opening portions for recognition, the recognition rate of the alignment in the foreign matter inspection step can be improved.

What is claimed is:

1. A semiconductor device comprising:

a semiconductor substrate having a surface provided with a metal wiring;

an insulating film that covers the surface of the semiconductor substrate; and a plurality of electrodes disposed on the insulating film and having mutually same planar shapes, wherein the insulating film has a plurality of opening portions formed to face respective bottom surfaces of the plurality of electrodes and expose the metal wiring, the plurality of opening portions include a first opening portion having a first planar configuration and a second opening portion having a second planar configuration different from the first planar configuration, the plurality of electrodes are arranged along one direction, an opening constituting the second opening portion has a larger width in another direction intersecting the one direction than an opening constituting the first opening portion, the metal wiring has a first wiring width in the other direction corresponding to a size of the first opening portion in a region where the first opening portion is formed and a second wiring width in the other direction corresponding to a size of the second opening portion in a region where the second opening portion is formed.

2. The semiconductor device according to claim 1, wherein the plurality of electrodes are arranged on the insulating film in a predetermined repeated pattern, and the insulating film has at least one of the second opening portion for each region including a group of electrodes included in the predetermined repeated pattern among the plurality of electrodes.

3. The semiconductor device according to claim 1, wherein the second opening portion is an opening portion for recognition for alignment of an inspection device that inspects the surface of the semiconductor substrate, and at least one of the second opening portion is formed for each region corresponding to a field of view of the inspection device.

4. The semiconductor device according to claim 1, wherein the first opening portion is constituted by a first number of openings, and the second opening portion is constituted by a second number of openings, the first number and the second number being different from each other.

5. The semiconductor device according to claim 1, wherein the first opening portion is constituted by at least one opening of a first planar shape, and the second opening portion is constituted by at least one opening of a second planar shape different from the first planar shape.

6. The semiconductor device according to claim 1, wherein the second opening portion is an opening portion for recognition provided for performing alignment by an inspection device that inspects a surface of the semiconductor substrate, and at least one of the second opening portion is formed for each region corresponding to a field of view of the inspection device, a wiring portion having the second wiring width of the metal wiring is an opening-portion-for-recognition connecting wire portion provided to form the opening portion for recognition.

7. The semiconductor device according to claim 1, wherein the second opening portion has a shape including a first straight portion formed on a portion of the metal wiring having the first wiring width and extending along a wiring direction of the metal wiring and a second straight portion protruding from the first straight portion and extending up to on a portion of the metal wiring having the second wiring width.

* * * * *